(12) United States Patent
Stone

(10) Patent No.: US 6,897,643 B2
(45) Date of Patent: May 24, 2005

(54) INTEGRATED CIRCUIT DRIVER HAVING STABLE BOOTSTRAP POWER SUPPLY

(75) Inventor: Marshall David Stone, Fremont, CA (US)

(73) Assignee: Monolithic Power Systems, Inc., Los Gatos, CA (US)

(*) Notice: Subject to any disclaimer, the term of this patent is extended or adjusted under 35 U.S.C. 154(b) by 91 days.

(21) Appl. No.: 10/269,617

(22) Filed: Oct. 11, 2002

(65) Prior Publication Data

US 2004/0070383 A1 Apr. 15, 2004

(51) Int. Cl.[7] .............................. G05F 1/40; H03K 17/60
(52) U.S. Cl. ...................... 323/288; 323/224; 327/390; 327/589
(58) Field of Search ................................ 323/288, 224, 323/286, 282, 289, 225, 284, 285, 287; 363/60, 98, 17, 56, 132; 327/387, 390, 374–377, 434, 589, 537, 538, 536; 307/910, 475, 482, 578

(56) References Cited

U.S. PATENT DOCUMENTS

| | | | | |
|---|---|---|---|---|
| 4,883,978 A | * | 11/1989 | Ohshima et al. ............... 326/24 |
| 5,365,118 A | | 11/1994 | Wilcox |
| 5,550,436 A | | 8/1996 | Houk |
| 5,627,460 A | * | 5/1997 | Bazinet et al. ............... 323/288 |
| 5,828,262 A | * | 10/1998 | Rees .......................... 327/390 |
| 6,172,493 B1 | * | 1/2001 | Grant ......................... 323/288 |
| 6,462,522 B2 | * | 10/2002 | Burstein et al. ............ 323/282 |
| 6,661,208 B2 | * | 12/2003 | Rutter et al. ................. 323/224 |
| 2002/0036487 A1 | | 3/2002 | Moriconi et al. |

* cited by examiner

Primary Examiner—Rajnikant B. Patel
(74) Attorney, Agent, or Firm—Perkins Coie LLP

(57) ABSTRACT

An integrated circuit driver is disclosed. The driver comprises a high side transistor and a low side transistor connected in series. The output of the driver is taken from the source of the high side transistor and the drain of the low side transistor. A bootstrap contact pad is connected to the output node. Connected to the bootstrap contact pad is a bootstrap capacitor that is also connected to a high side gate drive that selectively controls the high side transistor.

14 Claims, 4 Drawing Sheets

INTEGRATED CIRCUIT DRIVER HAVING STABLE BOOTSTRAP POWER SUPPLY

TECHNICAL FIELD

The present invention relates to integrated circuit drivers that use a bootstrap supply to drive the gate of the high side switch, and more particularly, to a method and apparatus for providing a stable bootstrap voltage to the gate of the high side switch.

BACKGROUND

One common type of integrated circuit driver utilizes two power MOSFET switches in a totem pole (half-bridge) topology. The MOSFET switches are typically NMOS switches that are connected in series. The power MOSFET switches are driven to conduct alternately. One of the MOSFET switches is designated as a high side switch, and the other MOSFET switch is designated as the low side switch. In one application, by selectively switching the power MOSFET switches in an alternating fashion, a load can be driven with an alternating current. In such a manner, a DC to AC inverter is formed. Likewise by controlling the switches according to an input signal (such as an acoustic signal), a class D audio amplifier is formed. Further, the same half bridge topology using a stable DC reference as the input can be used to create a DC power supply.

The gate of the high side switch is typically driven by a bootstrapped power supply. This is done to allow use of an NMOS switch, which has roughly half the on resistance of a PMOS switch of the same area. A bootstrap capacitor is used to increase the voltage available to the gate of the high side switch. FIG. 1 shows a prior art simplified schematic of an integrated circuit driver (IC) used in conjunction with a bootstrap capacitor to drive a load. The IC driver provides current to drive a load. A bootstrap capacitor $C_b$ has one terminal connected to the output of the IC driver. The other terminal of the bootstrap capacitor $C_b$ is provided back to the IC driver to drive the gate of the high side switch.

A more detailed schematic of the IC driver of FIG. 1 is shown in FIG. 2. As seen in FIG. 2, the IC driver 101 includes the high side switch 107 and the low side switch 109. The high side switch 107 is driven by gate drive and fault circuit 111. Similarly, the low side switch 109 is driven by gate drive and fault circuit 113. The gate drive and fault circuits 111 and 113 are operative to control the switching of the high side and low side switches 107 and 109. In addition, the gate drive and fault circuits 111 and 113 typically include fault detection circuitry and a bootstrap supply monitor. These additional functions are generally needed to measure whether there is a fault condition on the switch or whether the bootstrap supply is sufficient for the IC to operate properly.

The precise configuration of the gate drive and fault circuits 111 and 113 may be varied, but generally the configuration and operation is well known in the prior art. Note that the gate drive and fault circuit 113 used to control the low side switch 109 operates using a first supply voltage $V_{sp1}$. The low side switch 109 does not require a bootstrapped power supply. In contrast, the gate drive and fault circuit 111 that controls the high side switch 107 is connected to the bootstrap capacitor 103.

The output of the IC driver 101 is taken from the node connecting the high side switch and the low side switch. In physical terms, the output node is a conductive pad on the integrated circuit, designated in FIG. 2 as $SW_{pad}$ 115. The integrated circuit die is then set into a package wherein the pad $SW_{pad}$ 115 is connected to a package pin $SW_{pin}$ 117. The connection between the pad 115 and the package pin 117 is typically made through a bond wire formed of gold, copper, or other highly conductive material.

Nevertheless, the bond wire between the pad 115 and the package pin 117 includes some finite amount of parasitic inductance $L_{p1}$ and parasitic resistance $R_{p1}$. When current is supplied through the pin 117 to the load 105, invariably there will be a loss of voltage across the parasitic inductance $L_{p1}$ and parasitic resistance $R_{p1}$.

The amount of the voltage drop is important because any voltage that develops across the bond wire between SW pad and SW pin, subtracts directly and instantaneously from the bootstrap supply. Because of the large value of current and high rate of change of that current in the bondwire, the voltage drop can be significant, on the order of two or more volts. This sudden drop in the internal bootstrap supply voltage will adversely affect any signal processing operating under the internal bootstrap supply, such as the bootstrap supply monitor and fault check circuits.

Therefore, the arrangement shown in FIG. 2 having an imprecise and noisy bootstrap supply is undesirable.

DETAILED DESCRIPTION

The present invention is an integrated circuit driver having a "quieter" bootstrap power supply. The integrated circuit driver has an output pin and output pad that is dedicated to the bootstrap capacitor thereby maintaining a stable bootstrap supply voltage. In the following description, some specific details, such as example values for the circuit components, are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Figure 1:
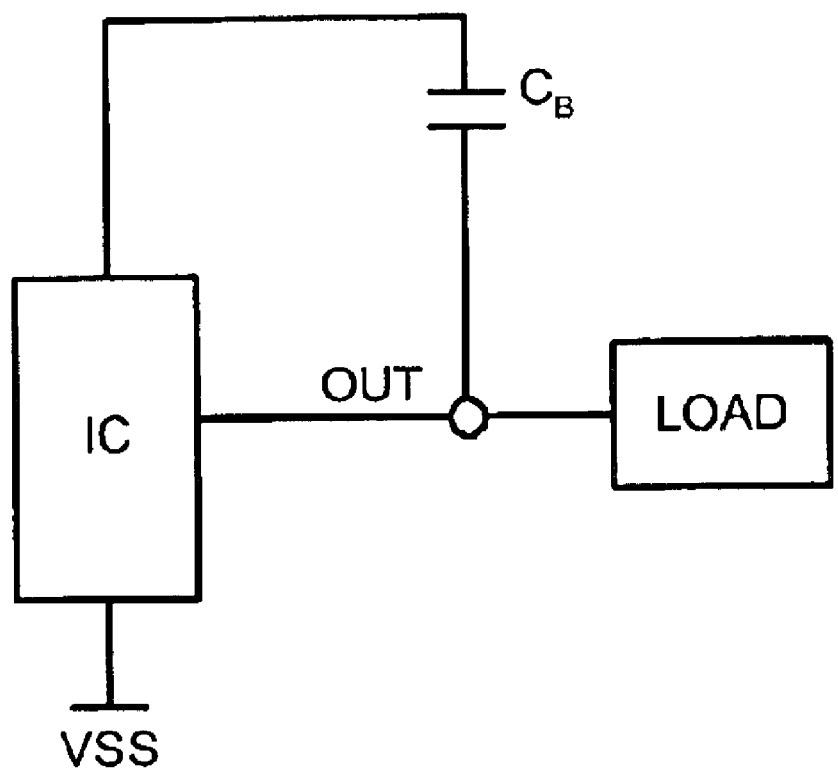
FIG. 1 is a schematic diagram showing a bootstrap capacitor and an integrated circuit driver for driving a load.
Figure 2:
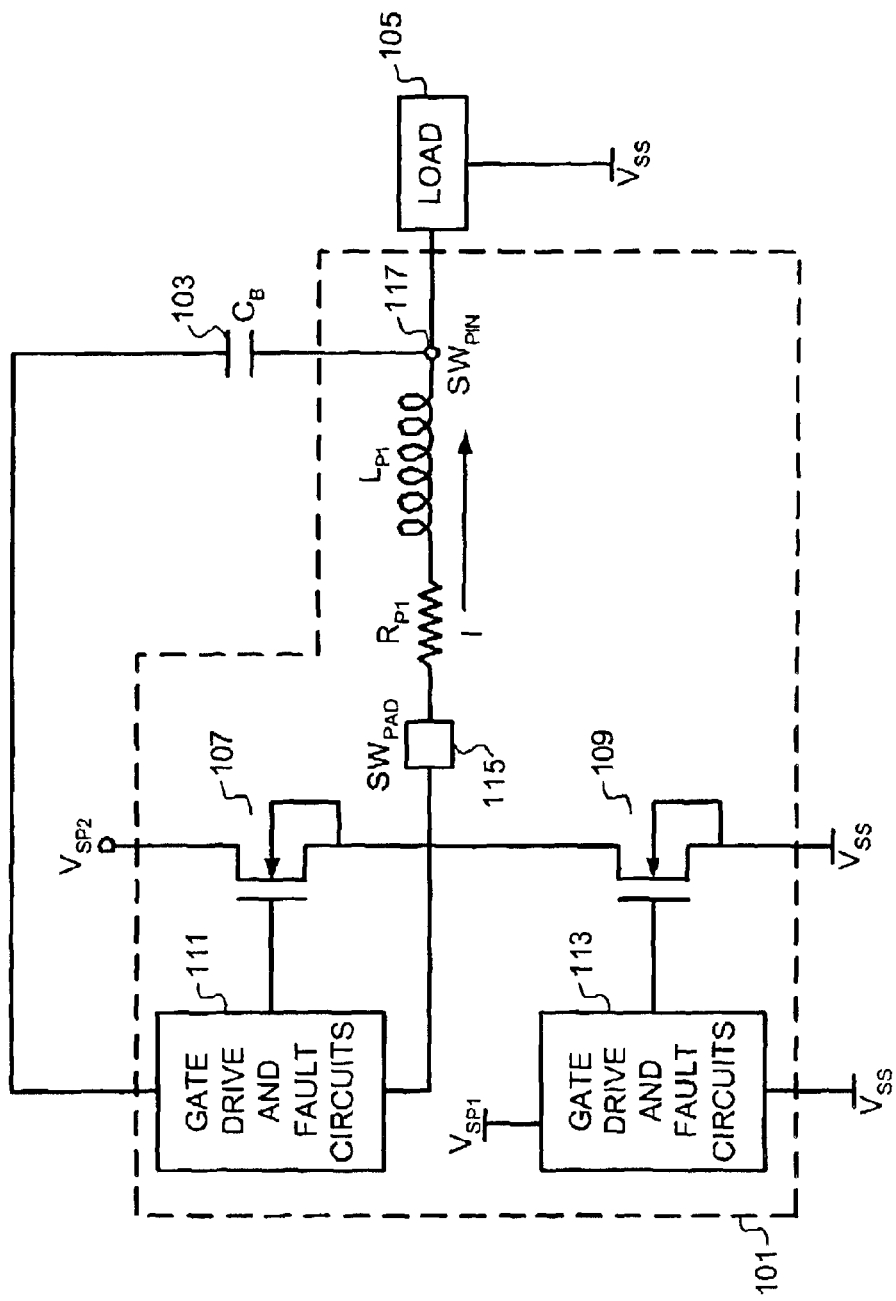
FIG. 2 is a detailed schematic of the integrated circuit driver of FIG. 1.
Figure 3:
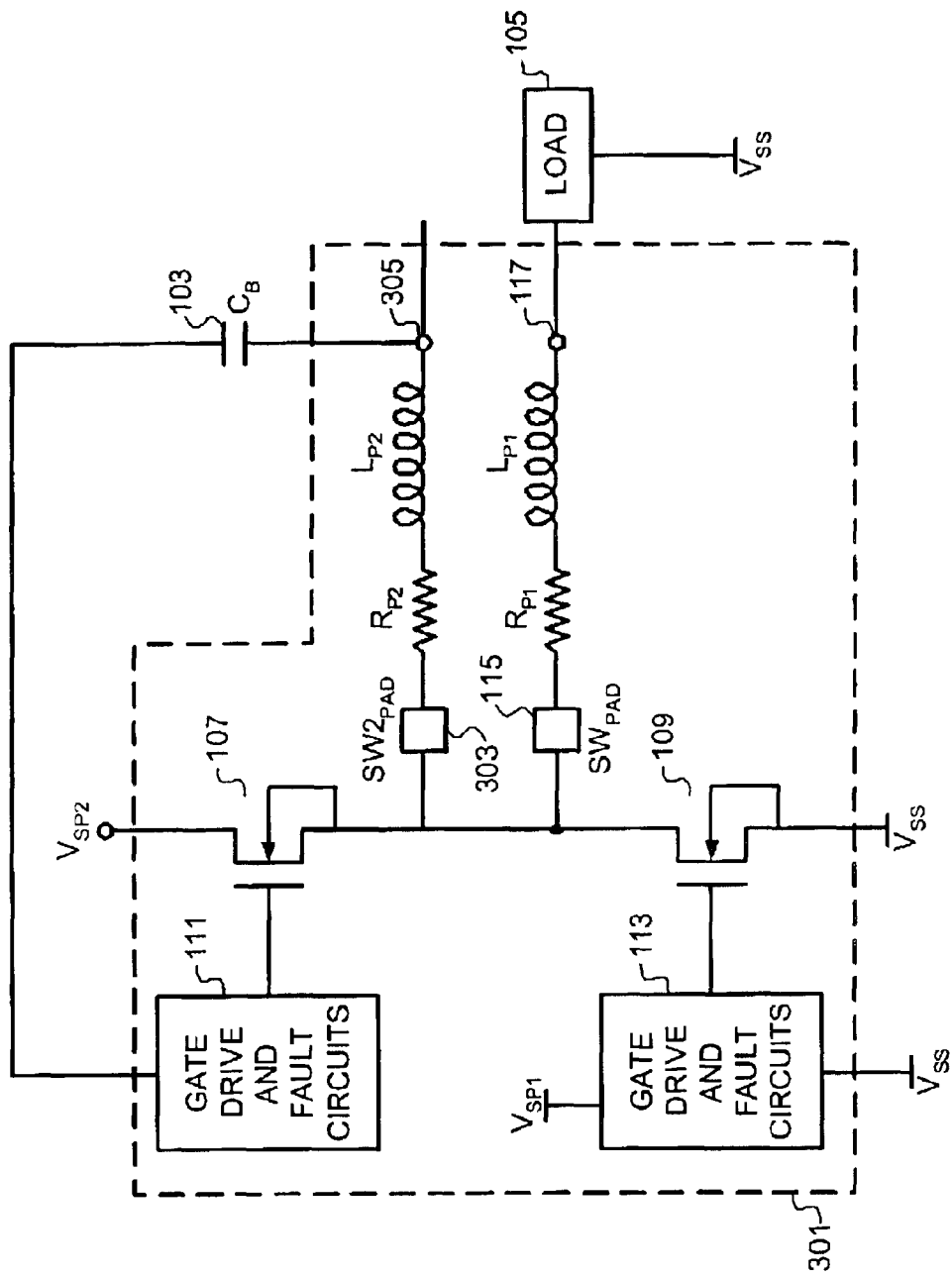
FIG. 3 is a schematic circuit diagram illustrating one embodiment of the present invention.

FIG. 3 shows one embodiment of the present invention. As seen, FIG. 3 is substantially similar to the prior art IC driver 101, except that an additional pad $SW2_{pad}$ 303 is also attached to the output node between the high side switch 107 and the low side switch 109. Additionally, a second output pin 305 is provided from the IC driver 301. Having the second pad 303 and the second package pin 305 connected to the bootstrap capacitor 103, the bootstrap capacitor 103 is not affected by any voltage drop caused by current flowing to the load 105 through a first package pin 117.

Note that substantially all the current provided by the high side switch 107 and the low side switch 109 flows to the load 105 through the package pin 117. Little if any current flows through the second package pin 305, thereby eliminating any voltage drop through the parasitic resistance and inductance of the bond wire connecting the second package pin 305 to the second pad 303. Thus, the bootstrap supply voltage provided by the bootstrap capacitor 103 maintains its value and is less noisy.

As seen, the IC driver 301 of the present invention includes an additional package pin 305 that is connected directly to the bootstrap capacitor 103. In an alternative embodiment, the second package pin 305 has a bond wire directly attached to the same pad 115 as the first package pin 117. This saves the requirement for forming the second pad 303. In one embodiment, the IC driver 301 may be used to drive, for example, a cold-cathode fluorescent lamp. However, typically, the lamp is connected through a secondary winding of a transformer whose primary winding is connected to the output of the IC driver 301.

Figure 4:
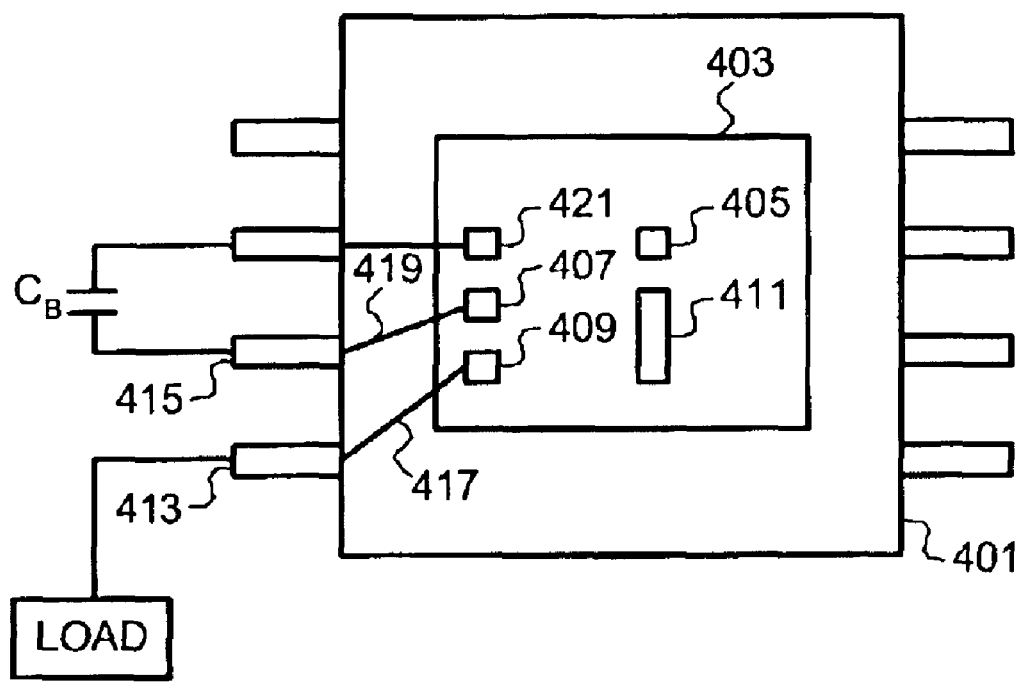
FIG. 4 is an illustration of an integrated circuit die mounted on an integrated circuit package.

FIG. 4 further illustrates the arrangement of the present invention. In FIG. 4, an integrated circuit package 401 is adapted to mount an integrated circuit die 403. The integrated circuit die 403 includes various circuitry, such as the low side switch, the high side switch, and the gate drive and fault circuitry. In addition, the integrated circuit die 403 includes an output contact pad 409, a bootstrap contact pad 407 (referred to as a second pad $SW2_{pad}$ 303 in FIG. 3), a high side gate drive input pad 421, and various other contact pads 405 and 411.

The output contact pad 409 is connected to an output pin 413 of the integrated circuit package 401 by an output bond wire 417. The output bond wire 417 is secured to the output pin 413 and the output contact pad 409. The bootstrap contact pad 407 is connected to bootstrap pin 415 of the integrated circuit package 401 by a bootstrap bond wire 419. The bootstrap bond wire 419 is secured to the bootstrap pin 415 and the bootstrap contact pad 407.

The bootstrap capacitor $C_b$ is connected between the bootstrap pin 415 and the gate drive circuitry on the integrated circuit 403 through another package pin and high side gate drive input pad 421. Finally, the load is connected to the output pin 413. The other various pins of the integrated circuit package 401 are used in known configurations, such as for power supply, ground, control lines, and such.

As noted above, in an alternate embodiment, the output contact pad 409 and the bootstrap contact pad 407 is one and the same. Whichever pad conducts current to the load is made large, such as contact pad 411, but not changed in size if also attached to Cb.

Thus, the above described IC driver provides a stable bootstrap power supply, even when large amounts of power are being delivered. This is accomplished by connecting the bootstrap capacitor to a dedicated bootstrap pin and contact pad.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. An integrated circuit driver comprising:

a high side transistor;

a low side transistor connected in series to said high side transistor such that the source of said high side transistor is connected to the drain of said low side transistor, the source of the high side transistor and the drain of the low side transistor forming an output node;

a bootstrap contact pad connected to the output node;

a bootstrap capacitor having a first terminal connected to said bootstrap contact pad, wherein the bootstrap capacitor couples to the gate and the source of the high side transistor;

a high side gate drive for selectively controlling the high side transistor, said high side gate drive having as an input a signal from a second terminal of said bootstrap capacitor;

a low side gate drive for selectively controlling the low side transistor; and an output contact pad connected to the output node, said output contact pad providing an output signal to a load.

2. The driver of claim 1 wherein said high side transistor and said low side transistor are NMOS transistors.

3. The driver of claim 1 wherein said output contact pad and said bootstrap contact pad are the same.

4. The driver of claim 1 further including an output package pin connected to said output pad by an output bond wire.

5. The driver of claim 1 further including a bootstrap package pin connection to said bootstrap contact pad by a bootstrap bond wire.

6. The driver of claim 3 further including an output package pin connected to said output pad by an output bond wire.

7. The driver of claim 3 further including a bootstrap package pin connection to said bootstrap contact pad by a bootstrap bond wire.

8. An integrated circuit package comprising:

(a) an integrated circuit die, said die having formed thereon:

(1) a high side transistor;

(2) a low side transistor connected in series to said high side transistor such that the source of said high side transistor is connected to the drain of said low side transistor, the source of the high side transistor and the drain of the low side transistor forming an output node;

(3) a set of two bootstrap contact pads connected to the output node;

(4) a high side gate drive for selectively controlling the high side transistor;

(5) a low side gate drive for selectively controlling the low side transistor; and (6) a set of two output contact pads connected to the output node, said output contact pads providing output signals to a load;

(b) a set of two carrier packages having a plurality of package pins including at least a bootstrap package pin and an output package pin, said carrier packages for securing said integrated circuit die;

(c) a set of two output bond wires connecting said output contact pads with said output package pins; and (d) a set of two bootstrap bond wires connecting said bootstrap contact pads with said bootstrap package pins.

9. The package of claim 8 wherein said high side transistor and said low side transistor are NMOS transistors.

10. The package of claim 8 wherein said output contact pad and said bootstrap contact pad are the same.

11. The package of claim 8 wherein a first terminal of a bootstrap capacitor is connected to said bootstrap package pin and a second terminal of said bootstrap capacitor is connected to an input to said high side gate drive.

12. A method for driving a load using a high side switch and a low side switch connected in series, the source of said high side switch connected to the drain of said low side switch, the connection of said high side switch and said low side switch being an output node, the method comprising:

providing a bootstrap contact pad connected to said output node;

providing an output pad connected to said output node;

connecting a bootstrap capacitor to said bootstrap contact pad, said bootstrap capacitor used to provide a bootstrap power supply to a gate drive of said high side switch, wherein the bootstrap capacitor couples to the gate and the source of the high side transistor; and connecting said output pad to said load.

13. An integrated circuit driver comprising:

a high side transistor;

a low side transistor connected in series to said high side transistor such that the source of said high side transistor is connected to the drain of said low side transistor, the source of the high side transistor and the drain of the low side transistor forming an output node;

a combination bootstrap/output contact pad connected to the output node;

a bootstrap capacitor having a first terminal connected to said bootstrap/output contact pad via a bootstrap capacitor package pin, wherein the bootstrap capacitor couples to the gate and the source of the high side transistor;

a high side gate drive for selectively controlling the high side transistor, said high side gate drive having as an input a signal from a second terminal of said bootstrap capacitor;

a low side gate drive for selectively controlling the low side transistor; and an output package pin connecting said bootstrap/output contact pad to a load.

14. The driver of claim 13 wherein said high side transistor and said low side transistor are NMOS transistors.

* * * * *